United States Patent
Abbasi et al.

(10) Patent No.: US 8,169,242 B2
(45) Date of Patent: May 1, 2012

(54) PROGRAMMABLE FINE LOCK/UNLOCK DETECTION CIRCUIT

(75) Inventors: Saeed Abbasi, Valley Forge, PA (US); Raymond S P Tam, Toronto (CA); Nima Gilanpour, North York (CA)

(73) Assignees: ATI Technologies ULC, Markham, Ontario (CA); Advanced Micro Devices, Inc., Sunnyvale, CA (US)

( * ) Notice: Subject to any disclaimer, the term of this patent is extended or adjusted under 35 U.S.C. 154(b) by 170 days.

(21) Appl. No.: 12/779,637

(22) Filed: May 13, 2010

(65) Prior Publication Data
US 2011/0279156 A1    Nov. 17, 2011

(51) Int. Cl.
H03L 7/06    (2006.01)
(52) U.S. Cl. ........................ 327/156; 327/147
(58) Field of Classification Search .................. 327/147, 327/156
See application file for complete search history.

(56) References Cited

U.S. PATENT DOCUMENTS

| | | | |
|---|---|---|---|
| 6,411,142 B1 | 6/2002 | Abbasi et al. | |
| 6,831,492 B1 | 12/2004 | Abbasi et al. | |
| 6,859,108 B2 | 2/2005 | Abbasi et al. | |
| 6,903,586 B2 | 6/2005 | Abbasi et al. | |
| 7,034,590 B2 * | 4/2006 | Shin | 327/158 |
| 7,173,668 B2 * | 2/2007 | Renner et al. | 348/531 |
| 2005/0007166 A1 * | 1/2005 | Shin | 327/158 |
| 2005/0018080 A1 * | 1/2005 | Renner et al. | 348/540 |
| 2005/0262373 A1 * | 11/2005 | Kim | 713/401 |
| 2006/0145741 A1 * | 7/2006 | Panpalia et al. | 327/158 |
| 2011/0279156 A1 * | 11/2011 | Abbasi et al. | 327/158 |

* cited by examiner

Primary Examiner — Lincoln Donovan
Assistant Examiner — Adam Houston
(74) Attorney, Agent, or Firm — Faegre Baker Daniels LLP

(57) ABSTRACT

An integrated circuit includes a feedback controlled clock generating circuit, such as a DLL, PLL or other suitable circuit, that is operative to provide a feedback reference frequency signal based on a generated output clock signal. The integrated circuit also includes a programmable fine lock/unlock detection circuit that includes programmable static phase error sensitivity logic that senses phase error. The programmable static phase error sensitivity logic sets a phase lock sensitivity window used to determine a fine lock/unlock condition of the generated output clock signal. The programmable fine lock/unlock detection logic is also operative to generate a fine phase lock/unlock signal based on the set phase lock sensitivity window. The integrated circuit may also include a coarse lock detection circuit that generates a coarse lock signal based on a frequency unlock condition.

19 Claims, 6 Drawing Sheets

PROGRAMMABLE FINE LOCK/UNLOCK DETECTION CIRCUIT

BACKGROUND OF THE DISCLOSURE

The disclosure relates to delay lock loop circuits and/or phase locked loop circuits and more particularly to such circuits that employ lock and/or unlock detection.

Feedback controlled clock generating circuits, such as phase locked loop circuits (PLL) and delay locked loop circuits (DLL) are known for use in integrated circuits that require clock sources. Phase locked loop circuits, for example, lock to a desired clock frequency and as shown in FIG. 1, they typically include a phase frequency detector 100, a charge pump 102, a low pass filter 103, a voltage controlled oscillator 104, a loop divider 106 and a frequency based clock lock and unlock detector 108. Such frequency base lock and unlock detectors typically provided coarse directional change detection and coarse clock unlock detection by generating a coarse frequency based unlock signal 110 to core logic 112 that utilized the generated output clock 114 generated from the PLL. The core logic 112 such as a processor core or other suitable circuit responded to the coarse unlock signal by shutting down or performing other operations since it was informed that it could not trust the generated clock signal 114.

The phase frequency detector 100 receives a reference frequency 116 as input from a suitable reference frequency generator, and also received the feedback reference frequency 118 fed back from, for example, the loop divider 106. The phase frequency detector generates up and down frequency detection signals 120 and 122 to the charge pump 102 to control the voltage controlled oscillator 104 to maintain a constant output clock frequency 114 as known in the art. The frequency based lock and unlock detector 108 was responsive to the up and down control signals 120 and 122 to detect the change in frequency provided by the phase frequency detector 100. However, such frequency based lock and unlock detectors typically provided only a coarse unlock detection so that the logic core 112 was unable to determine whether the reason for the unlocked clock output 114 was due to a frequency error, phase error, or other error. A frequency based lock and unlock detector 108 may employ, for example, a counter that counts the amount of time the PLL is not locked such as single coarse unlock signal 110 is typically provided.

FIG. 2 illustrates one example of a PLL unlock detector circuit as known in the art. In this example, the coarse PLL unlock signal 110 is generated using an unlock detector circuit 200 that employs up and down reference clock and feedback clock latches 202, corresponding multiplexers 204 and 206, and logic elements 208 and 210 that are coupled to OR gate 212. As to the unlock detector, in one example the PLL has a built-in unlock-detector 108 that provides flags to an ASIC 112 about the locking-status of the PLL. This detector output, O_UNLOCK, will indicate a logic "0" and a logic "1" when the PLL is in the "lock" and "unlock" state, respectively. The accuracy can be adjusted by IUNLOCK_DET according to table 1 below. The functional table is presented in table 2. Setting IUNLOCK_DET to zero bypasses the unlock detector circuit. IUNLOCK_SEL can be used to select the 50% (depends on duty cycle of reference clock source at input of PFD) or 100% (1 complete clock cycle) phase error detection. (IUNLOCK_SEL_SYS=1 for 100% and IUNLOCK_SEL_SYS=0 for 50%). The accuracy of the detected phase error depends on the input reference clock's duty cycle. For example, if the reference clock's duty cycle is 30%, any phase error bigger than 30% of reference clock's period will be detected as an unlock state. IUNLOCK_DET_32_[3:0] value indicates the number of consecutive unlock signals detected during multiple reference clock cycles (i.e. if IUNLOCK_DET_32_[3:0]=0111, and unlock signal is flagged, the phase error has been bigger than 50% of REF clock's period for seven conservative clock cycles.)

As shown in FIG. 2. UP and DN signals generated by PFD are sampled at the falling edge of REF and FB clocks. Depending on the PFD topology there is a minimum UP/DN pulse width which may be sampled as a wrong unlock situation. The minimum UP/DN pulse is estimated as 2 ns therefore the sampling clock should be high more than 2 ns. For example if the REF clock is running at 50 MHz (period 20 ns) the duty cycle should not be worst than 10%-90% otherwise the minimum UP pulse can be detected as unlock signal.) The logic element 208 counts a number of offsets for the REF clock and the logic element 210 counts the number of offsets of the FB clk and an unlock condition signal is output if the counts exceed a set number. However, this is merely a coarse frequency unlock condition detector.

A need exists for an improved PLL or DLL lock and/or unlock detection circuit.

BRIEF DESCRIPTION OF THE DRAWINGS

The embodiments will be more readily understood in view of the following description when accompanied by the below figures and wherein like reference numerals represent like elements, wherein.

DETAILED DESCRIPTION OF THE PREFERRED EMBODIMENTS

Figure 1:
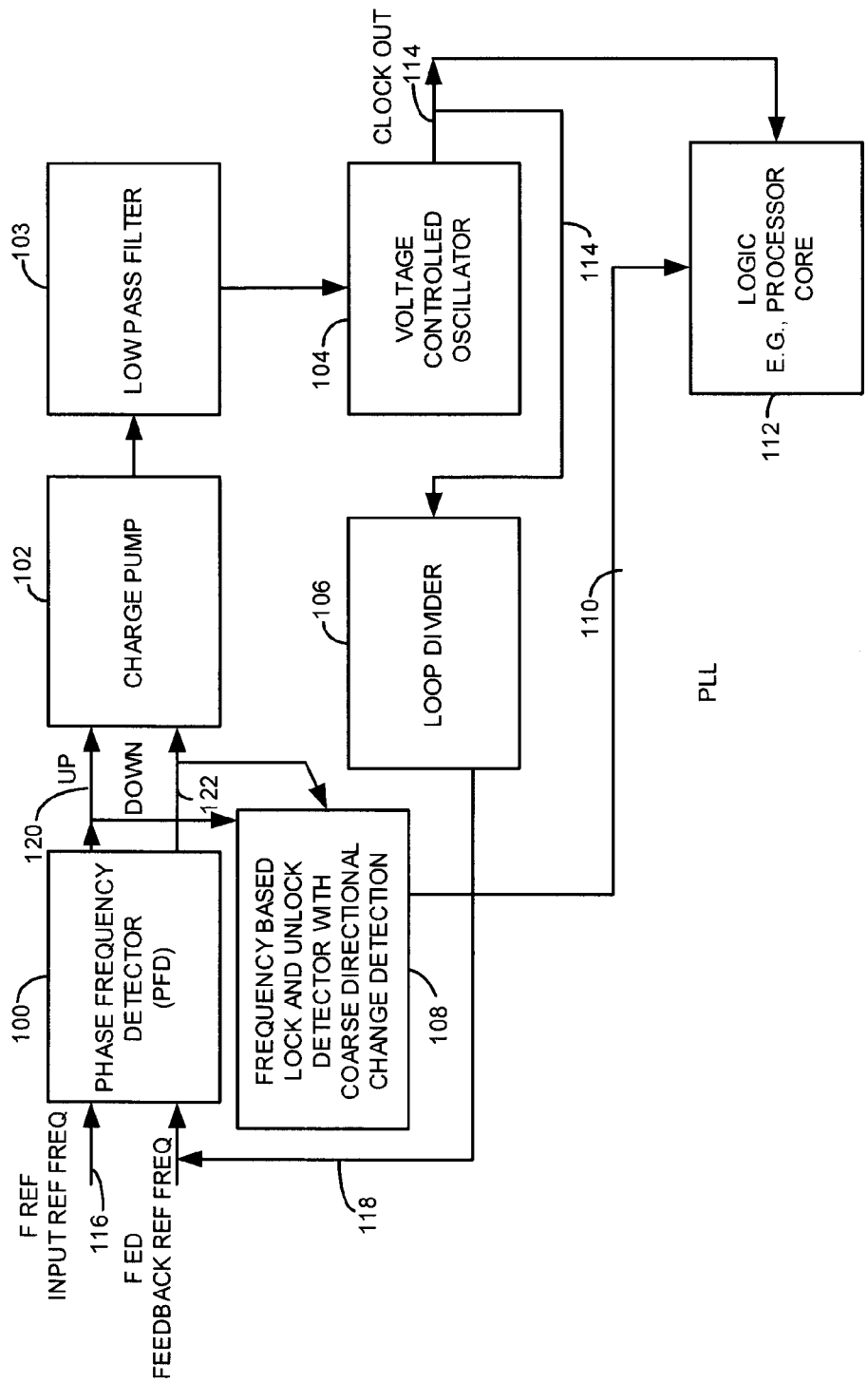
FIG. 1 is one example of a prior art PLL.
Figure 2:
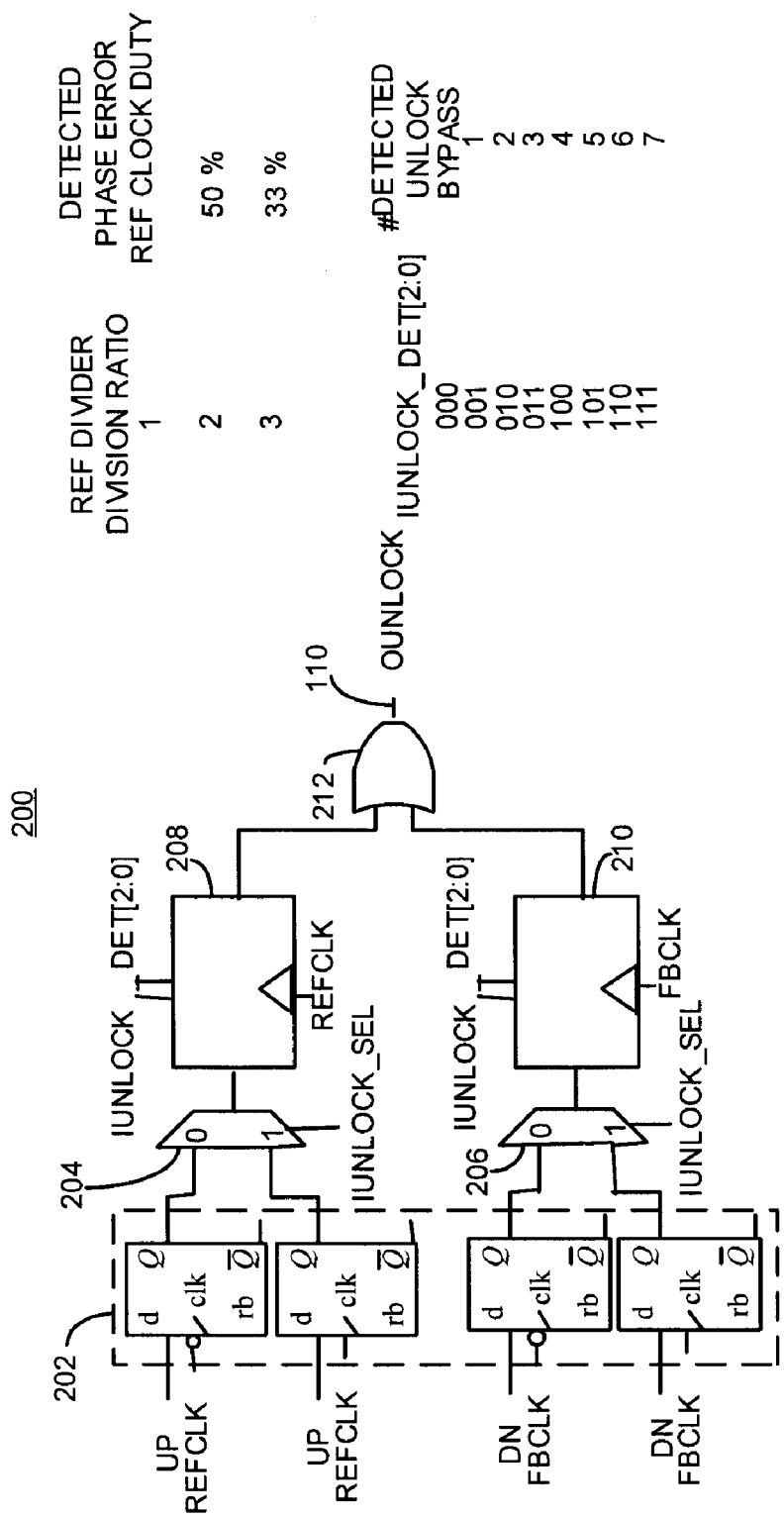
FIG. 2 is a block diagram of one example of a prior art clock unlock detector employed, for example, in the PLL of FIG. 1.

Briefly, an integrated circuit includes a feedback controlled clock generating circuit, such as a DLL, PLL or other suitable circuit, that is operative to provide a feedback reference frequency signal based on a generated output clock signal. The integrated circuit also includes a programmable fine lock/unlock detection circuit that includes programmable static phase error sensitivity logic that senses phase error. The programmable static phase error sensitivity logic sets a phase lock sensitivity window used to determine a fine lock/unlock condition of the generated output clock signal. The programmable fine lock/unlock detection logic is also operative to generate a fine phase lock/unlock signal based on the set phase lock sensitivity window. The programmable static phase error sensitivity logic may utilize programmable registers, for example, that allow the setting of the phase lock sensitivity window through software driver control, user control via a graphics user interface, or may be preprogrammed at fabrication. The integrate d circuit may also include a coarse lock detection circuit that generates a coarse lock signal based on a frequency unlock condition. Among other advantages, the integrated circuit includes a combination of programmable parameters to allow the lock/unlock detector operation to be programmed to detect both phase and frequency changes. The output clock signal lock or unlock detector operation can tolerate static phase error for example at inputs of the phase frequency detector and the circuit can be used in DLL or PLL and can also be used as a test circuit vehicle for DLLs and PLLs.

In another example, the coarse lock detection circuit includes a directional detection circuit operatively coupled to the programmable fine lock/unlock detection circuit and detects a number of changes in phase direction between the input reference frequency signal and the feedback reference frequency signal.

A method for controlling integrated circuit clock usage includes providing an output clock signal from a feedback based clock generation circuit and setting a phase lock sensitivity window used to determine a fine lock/unlock condition of the generated output clock signal. A method also includes generating a fine phase lock/unlock signal based on the set phase lock sensitivity window and preventing use of the output clock by core logic in response to the fine lock/unlock signal when the unlock condition is asserted. The method also includes allowing use of the output clock by the core logic in response to a coarse lock signal. The method also includes detecting a number of changes in phase direction between an input reference frequency signal and a feedback reference frequency signal and generating the coarse lock signal based on a number of detected changes in direction.

A computer readable medium is also disclosed that includes executable instructions that cause a circuit design system to produce an integrated circuit that includes the above mentioned circuits.

Figure 3:
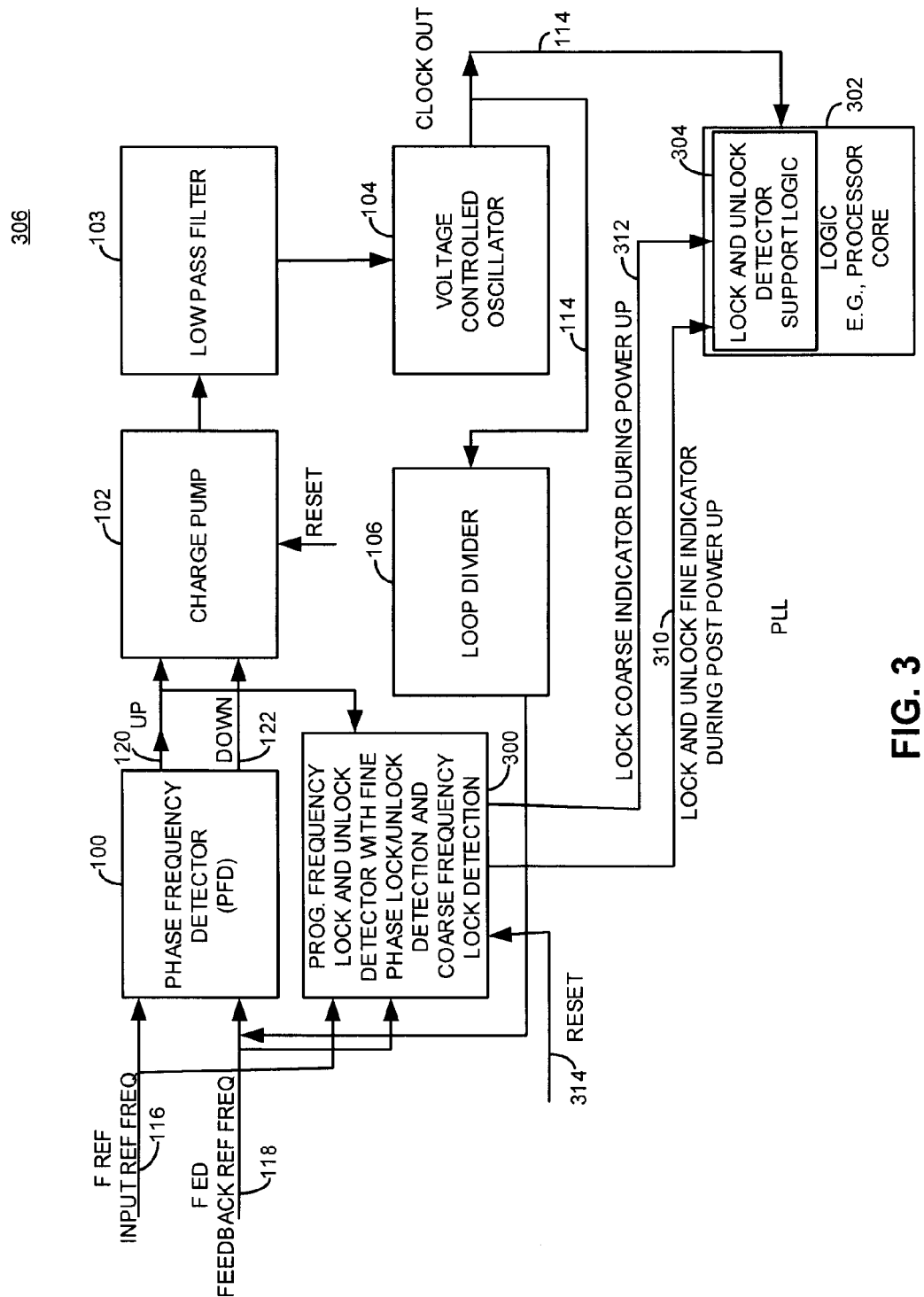
FIG. 3 is a block diagram illustrating one example of an integrated circuit employing a PLL and programmable frequency lock and unlock detector with fine direction change and counter and fine lock/unlock detection in accordance with one embodiment.
Figure 6:
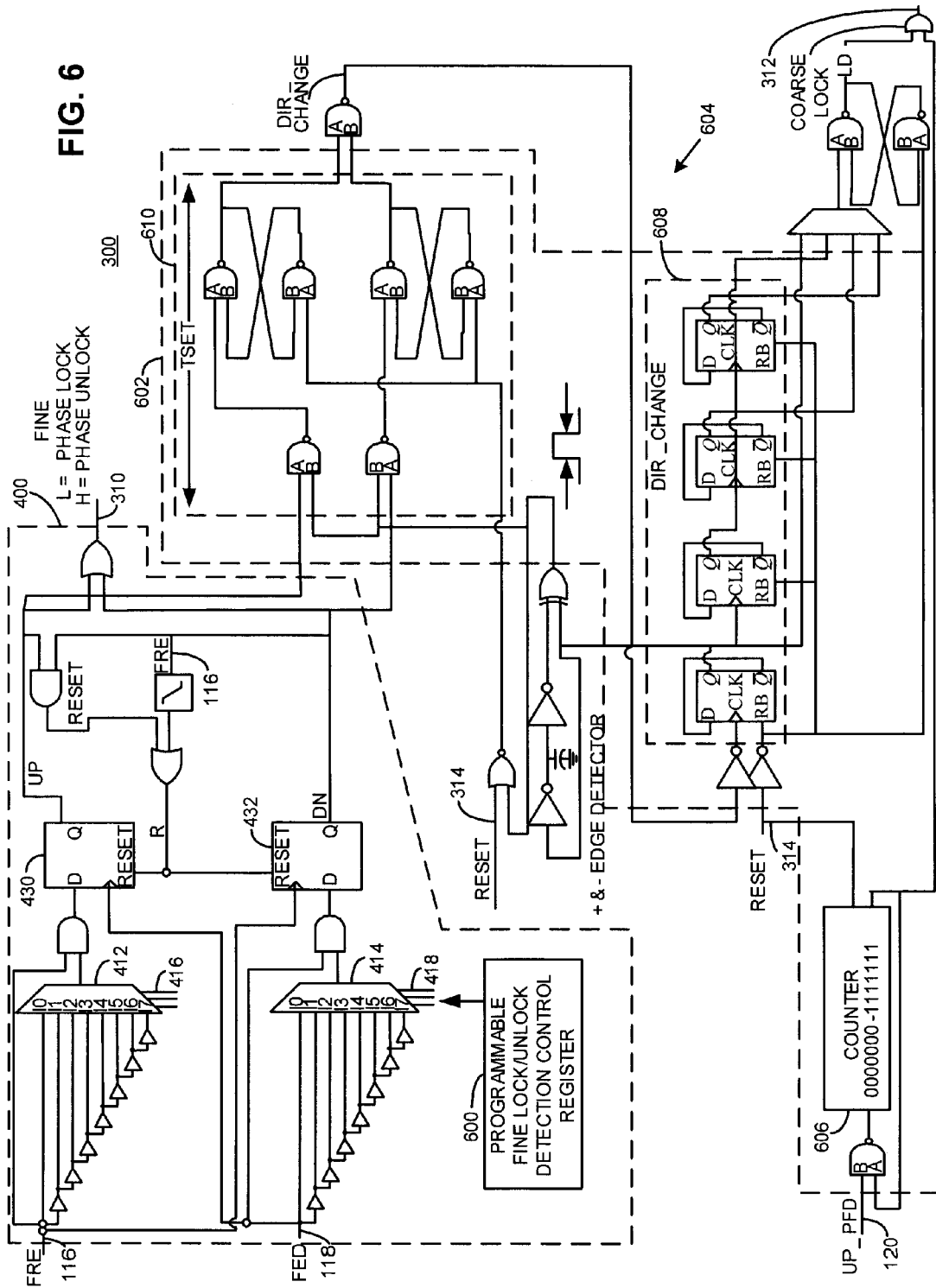
FIG. 6 is a block diagram illustrating one example of a portion of an integrated circuit that includes a programmable fine lock/unlock detection circuit and a coarse lock detection circuit in accordance with one example set forth in the disclosure.

FIG. 3 illustrates one example of an integrated circuit 306 that includes a programmable frequency lock and unlock detector with fine phase lock/unlock detection and coarse frequency lock detection logic 300 (See FIG. 6). In addition, integrated circuit 306 includes core logic 302, such as a processor core or other suitable logic that operates based on the output clock 114. The core logic 302 includes lock and unlock detector support logic 304 which may be implemented, for example, as a processor core executing instructions that when executed cause the lock and unlock detector support logic to operate as described. In this example, the programmable frequency lock and unlock detector with fine phase lock/unlock detection and coarse frequency lock detection logic 300 receives the reference frequency 116 and the feedback reference frequency 118 as well as up and down frequency detection signals 120 and 122 to produce a fine phase lock/unlock signal 310 and a coarse lock signal 312 for the lock and unlock detector support logic 304. The lock and unlock detector support logic 304 provides the core logic information indicating not only whether a frequency lock has occurred but whether an unlock condition has occurred due to a phase unlock condition so that it can determine whether or not it can trust the generated output clock signal 114. The programmable frequency lock and unlock detector with fine phase lock/unlock detection and coarse frequency lock detection logic 300 may also be reset through a reset signal 314. The integrated circuit 306 includes a feedback controlled clock generating circuit, in this example shown as a phase lock loop that includes conventional elements such as PFD 100, charge pump 102, low pass filter 103, voltage controlled oscillator 104, loop divider 106 which provide a feedback reference frequency signal 118 based on the generated output clock signal 114.

The support logic 304 monitors the input signals 312 and 310 during power up. The 312 input signal lets the system know when the PLL is in frequency lock. The 310 input signal continues to monitor the PLL after the 312 signal indicates phase lock and unlock.

Figure 4:
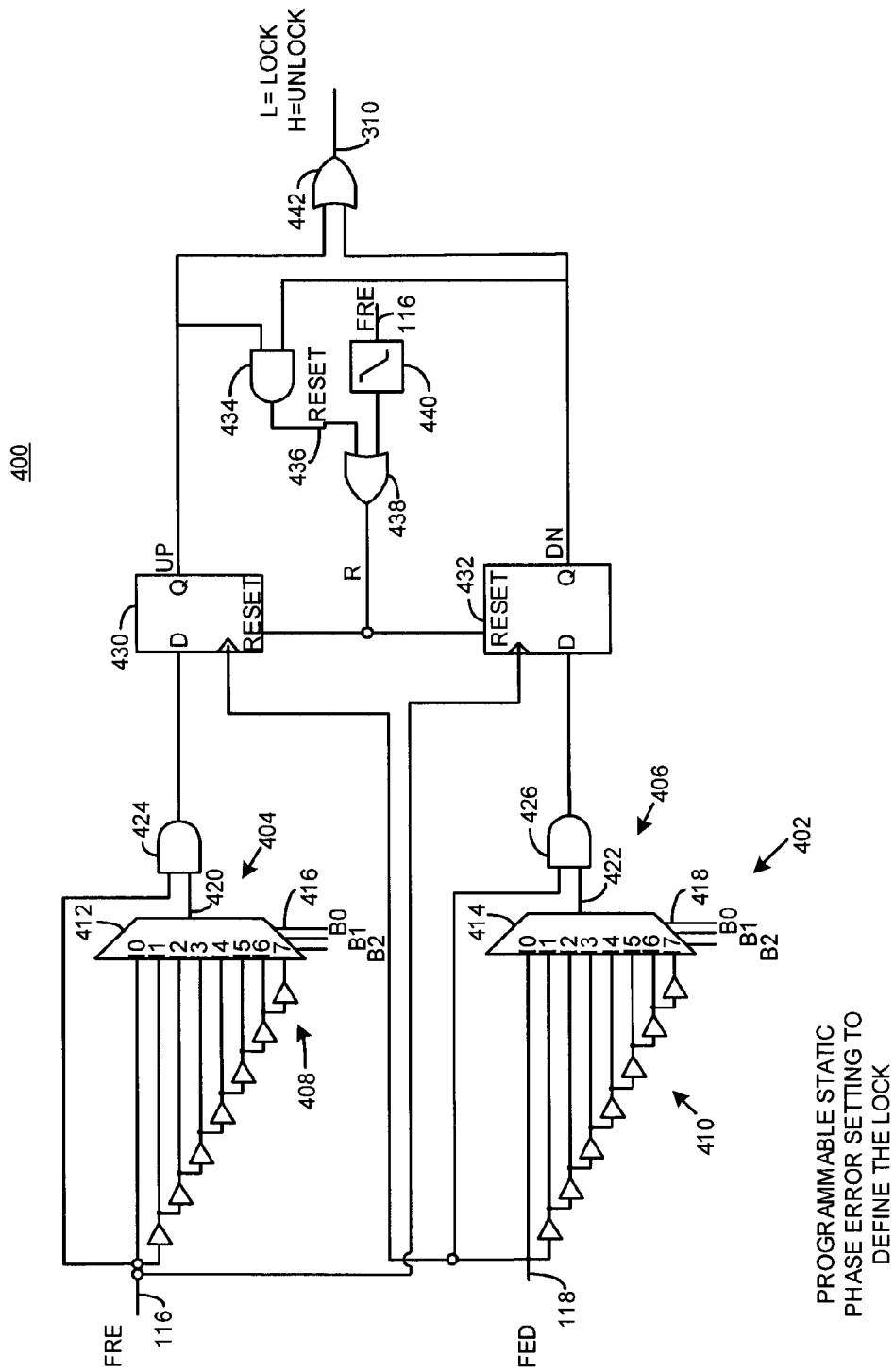
FIG. 4 is a block diagram illustrating one example of a programmable fine lock/unlock detection circuit in accordance with one example set forth in the disclosure.
Figure 5:
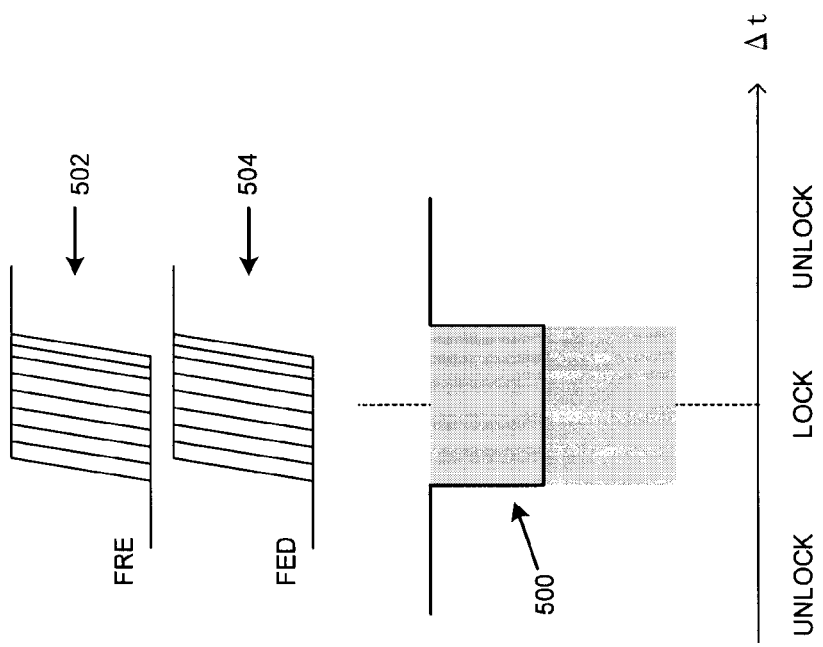
FIG. 5 is a diagram illustrating one example of a phase lock sensitivity window provided by the programmable fine lock/unlock detection circuit of FIG. 4.

FIG. 4 is a circuit diagram illustrating one example of a programmable fine lock/unlock detection circuit 400 which is a subsystem of the programmable frequency lock and unlock detector 300. Referring also to FIG. 5, the operation of the programmable fine lock/unlock detection circuit 400 will be described.

The programmable fine lock/unlock detection circuit 400 includes programmable static phase error sensitivity logic 402 that allows setting of a phase lock sensitivity window 500 that is used to determine a fine lock/unlock condition of the generated output clock signal 114 based on the feedback reference frequency signal 118 and the input reference frequency signal 116. The programmable fine lock/unlock detection circuit generates the fine phase lock/unlock signal 310 based on the set phase lock sensitivity window 500. The programmable static phase (also referred to as skew) error sensitivity logic includes a programmable register 600 (see FIG. 6) that may be programmed through an integrated circuit driver at power up, may be preloaded at manufacture, or may be programmed at any other suitable time.

The programmable fine lock/unlock detection control register 600 is coupled to a first variable delay control circuit 404 is operatively coupled to receive the input reference frequency signal 116 and to another variable delay control circuit generally shown as 406 that is operatively coupled to receive the feedback reference frequency signal 118. The variable delay control circuits 404 and 406 each include a series of corresponding programmable delays 408 and 410 respectively and multiplexers 412 and 414 that are controllable by, in this example, the programmable fine lock/unlock detection control register 600 through 3 control bits shown as 416 and 418 respectively. The output 420 and 422 of each respective multiplexer 412 and 414 is input to a respective AND gate 424 and 426. AND gate 424 also receives the reference clock frequency 116 whereas the AND gate 426 receives the feedback reference frequency signal 118. Flops 430 and 432 are coupled to receive as inputs, the outputs from respective AND gates 424 and 426. Each of the flops 430 and 432 are clocked wherein one of the flops 430 is clocked using the feedback reference frequency signal 118 whereas the flop 432 is clocked using the reference frequency 116. AND gate 434 is operatively coupled to receive as inputs the output of both of the flops 430 and 432 and produces a reset signal 436 which is coupled to OR gate 438. The output of OR gate 438 produces the reset signal for the flops 430 and 432. Block 440 is an edge detection block that detects the negative edge of the reference frequency signal. Block 440 receives the input reference frequency signal 116. OR gate 442 is coupled to receive the output from up flop 430 and down flop 432 and is operative to output the lock and unlock fine indicator signal 310. As shown, a fine lock is indicated with a logical low whereas a fine unlock condition based on phase detection variations beyond a sensitivity window is indicated by a logical high. However, it will be recognized that any suitable logic configuration may be employed.

The programmable fine lock/unlock detection circuit 400 is operative to programmably control detection of phase changes between the reference input frequency signal 116 with respect to the variable phase lock sensitivity window 500. The programmability (e.g., change the width of the sensitivity window 500) in this example is done via the use of the programmable control register 600 and delays which are programmed to vary the amount of delay allowed in the phase of each of the feedback reference frequency and the reference input frequency signals. This is shown, for example, by the phases of the signals FRE 502 and FED 504 occurring within the phase lock sensitivity window 500. When they are within the window, the signals are considered locked in phase and when the signals fall outside the window the phases are considered unlocked. The lock and unlock fine indicator signal 310 is generated to indicate whether the feedback reference frequency signal and reference input frequency signals are within the sensitivity window or outside the sensitivity window. The programmable fine lock/unlock detection circuit therefore generates a fine phase unlock signal when the phase changes are outside the phase lock sensitivity window 500 and generates a fine phase lock signal when the phase changes are within the phase lock sensitivity window 500. Detection by the programmable fine lock/unlock detection circuit may occur, for example, during post power up conditions. The coarse lock indicator 312 may be generated, for example, during power up, or any other suitable time if desired.

The control data 418 and 416 is provided by the programmable register in this example 600 to set the amount of sensitivity or the width of the sensitivity window 500.

Referring to FIG. 6, the programmable frequency lock and unlock detector with fine phase lock/unlock detection and coarse frequency lock detection logic 300 is shown. In addition to the programmable fine lock/unlock detection circuit 400, a coarse lock detection circuit 602 generates a coarse frequency lock signal 312 and is operative to detect a frequency lock condition. The coarse lock detection circuit 602 includes a directional detection circuit 604 that is coupled to the programmable fine lock/unlock detection circuit via the output of the flops 430 and 432. The directional detection circuit 604 detects a number of changes in phase direction between the input frequency signal 116 and the feedback reference frequency signal 118 and generates the coarse lock signal 312 (also referred to as the coarse lock indicator signal 312). This detection occurs when the phases or signals are outside the sensitivity window. The coarse lock detection circuit 602 also includes a counter circuit 606 that detects a static phase error larger than that detected by the programmable fine lock/unlock detection circuit and is operatively responsive to the up frequency detection signal 120 from the phase frequency detector. The directional detection circuit also uses counting logic 608 to count directional changes as detected by directional change detection logic 610. The number of NAND gates employed may adjust the amount of time set.

The reset signal 314 is used at power up to reset the circuitry. The counter 606 serves as a type of backup counter so that if the count is large, there is an indication of a large static phase error. This counter uses the up frequency detection signal 120 of the phase detector circuit to detect a lock based on the static phase error condition. The core logic 112 receives the fine phase lock/unlock signal 310 and the coarse lock indication signal 312 and prevents use of the output clock signal 114 during fine unlock conditions and during coarse unlock conditions.

A method for controlling integrated circuit clock usage includes providing an output clock signal 114 from a feedback based clock generation circuit such as a PLL. The method includes setting a phase lock sensitivity window 500 used to determine a fine lock/unlock condition of the generated output signal, such as via use of the input reference frequency signal and the feedback reference frequency signal 116 and 118 respectively. The method includes generating a fine phase lock/unlock signal 310 based on the set phase lock sensitivity window 500 and preventing use of the output clock 114 by core logic in response to the fine lock/unlock signal 114 when the unlock condition is asserted. The method also includes detecting a number of changes in phase direction between the input reference frequency signal and the feedback reference frequency signal and generating a coarse lock signal based on a number of detected changes in direction and allowing use of the output clock by the core logic in response to the coarse lock signal. As such, both a final lock/unlock signal based on phase error is used by core logic as well as a coarse lock signal to determine when to trust the output clock.

Also, integrated circuit design systems (e.g. work stations) are known that create integrated circuits based on executable instructions stored on a computer readable memory such as but not limited to CDROM, RAM, other forms of ROM, hard drives, distributed memory etc. The instructions may be represented by any suitable language such as but not limited to hardware description language, such as Verilog, GDSII or other suitable language. As such, the logic (e.g., circuits) described herein may also be produced as integrated circuits by such systems. For example an integrated circuit may be created using instructions stored on a computer readable medium that when executed cause circuit design system to produce an integrated circuit that comprises a feedback controlled clock generating circuit operative to provide a feedback reference frequency signal based on a generated output clock signal and a programmable fine lock/unlock detection circuit comprising programmable static phase error sensitivity logic operative to controllably set a phase lock sensitivity window used to determine a fine lock/unlock condition of the generated output clock signal and operative to generate a fine phase lock/unlock signal based on the controllably set phase lock sensitivity window and a coarse lock detection circuit as described.

The above detailed description of the invention and the examples described therein have been presented for the purposes of illustration and description only and not by limitation. For example multiple eye views may include more a right and left stereoscopic pair. It will be recognized that the above operations may be applied to differing types of 3D systems such as those that employ shutter glasses and other systems. It is therefore contemplated that the present invention cover any and all modifications, variations or equivalents that fall within the spirit and scope of the basic underlying principles disclosed above and claimed herein.

What is claimed is:

1. An integrated circuit comprising:
   a feedback controlled clock generating circuit operative to provide a feedback reference frequency signal based on a generated output clock signal; and
   a programmable fine lock/unlock detection circuit comprising programmable static phase error sensitivity logic operative to set a phase lock sensitivity window used to determine a fine lock/unlock condition of the generated output clock signal and operative to generate a fine phase lock/unlock signal based on the set phase lock sensitivity window.

2. The integrated circuit of claim 1 wherein the programmable static phase error sensitivity logic comprises a programmable register operatively coupled to:
   a first variable delay control circuit operatively coupled to receive an input reference frequency signal; and a second variable delay control circuit operatively coupled to receive the feedback reference frequency signal.

3. The integrated circuit of claim 2 further comprising a coarse lock detection circuit comprising a directional detection circuit operatively coupled to the programmable fine lock/unlock detection circuit and operative to detect a number of changes in phase direction between the input reference frequency signal and the feedback reference frequency signal and to generate a coarse lock signal.

4. The integrated circuit of claim 3 wherein the feedback clock generating circuit comprises a phase frequency detector operative to generate an up or down frequency detection signal based on a frequency difference between the reference input frequency signal and the feedback reference frequency signal and wherein the coarse lock detection circuit comprises a counter circuit operative to detect static phase error larger than that detected by the programmable fine lock/unlock detection circuit and is operatively responsive to the up frequency detection signal from the phase frequency detector.

5. The integrated circuit of claim 1 comprising a coarse lock detection circuit operatively coupled to the programmable fine lock/unlock detection circuit and wherein the programmable fine lock/unlock detection circuit is operative to programmably control detection of phase changes between a reference input frequency signal and a feedback reference frequency signal with respect to the phase lock sensitivity window to and generates a fine phase lock signal when the phase changes are within the phase lock sensitivity window and generates a fine phase unlock signal when the phase changes are outside the phase lock sensitivity window and wherein the coarse lock detection circuit is operative to detect a frequency lock condition.

6. The integrated circuit of claim 2 wherein the programmable static phase error sensitivity logic comprises logic operatively responsive to the first and second variable delay control circuits to generate the fine lock/unlock signal and wherein each of the first and second variable delay control circuits each comprises a multiplexing circuit and a plurality of delay stages coupled to inputs of the multiplexing circuit and wherein the multiplexing circuit is controlled based on control data from the programmable register.

7. An integrated circuit comprising:
a feedback controlled clock generating circuit operative to provide a feedback reference frequency signal based on a generated output clock signal;
a programmable fine lock/unlock detection circuit comprising programmable static phase error sensitivity logic operative to set a phase lock sensitivity window used to determine a fine lock/unlock condition of the generated output clock signal and operative to generate a fine phase lock/unlock signal based on the set phase lock sensitivity window;
a coarse lock detection circuit comprising a directional detection circuit operatively coupled to the programmable fine lock/unlock detection circuit and operative to detect a number of changes in phase direction between the input reference frequency signal and the feedback reference frequency signal and to generate a coarse lock indication signal; and
core logic operatively responsive to the fine phase lock/unlock signal and to the coarse lock indication signal and operative to prevent use of the output clock signal during fine unlock conditions and during coarse unlock conditions.

8. The integrated circuit of claim 7 wherein the programmable static phase error sensitivity logic comprises a programmable register operatively coupled to:
a first variable delay control circuit operatively coupled to receive an input reference frequency signal; and
a second variable delay control circuit operatively coupled to receive the feedback reference frequency signal.

9. The integrated circuit of claim 8 wherein the feedback clock generating circuit comprises a phase frequency detector operative to generate an up or down frequency detection signal based on a frequency difference between the reference input frequency signal and the feedback reference frequency signal and wherein the coarse lock detection circuit comprises a counter circuit operative to detect static phase error larger than that detected by the programmable fine lock/unlock detection circuit and is operatively responsive to the up frequency detection signal from the phase frequency detector.

10. The integrated circuit of claim 7 wherein the programmable fine lock/unlock detection circuit is operative to programmably control detection of phase changes between a reference input frequency signal and a feedback reference frequency signal with respect to the phase lock sensitivity window to and generates a fine phase lock signal when the phase changes are within the phase lock sensitivity window and generates a fine phase unlock signal when the phase changes are outside the phase lock sensitivity window and wherein the coarse lock detection circuit is operative to detect a frequency unlock condition.

11. The integrated circuit of claim 8 wherein the programmable static phase error sensitivity logic comprises logic operatively responsive to the first and second variable delay control circuits to generate the fine lock/unlock signal and wherein each of the first and second variable delay control circuits each comprises a multiplexing circuit and a plurality of delay stages coupled to inputs of the multiplexing circuit and wherein the multiplexing circuit is controlled based on control data from the programmable register.

12. A method for controlling integrated circuit clock usage comprising:
providing an output clock signal from a feedback based clock generation circuit;
setting a phase lock sensitivity window used to determine a fine lock/unlock condition of the generated output clock signal;
generating a fine phase lock/unlock signal based on the set phase lock sensitivity window; and
preventing use of the output clock by core logic in response to the fine lock/unlock signal when the unlock condition is asserted.

13. The method of claim 12 comprising detecting a number of changes in phase direction between an input reference frequency signal and a feedback reference frequency signal and generating a coarse lock signal based on a number of detected changes in direction and allowing use of the output clock by core logic in response to the coarse lock signal.

14. A non-transitory computer readable medium comprising:
executable instructions that when executed by one or more processors of a circuit design system, cause the circuit design system to produce an integrated circuit that comprises:
a feedback controlled clock generating circuit operative to provide a feedback reference frequency signal based on a generated output clock signal; and
a programmable fine lock/unlock detection circuit comprising programmable static phase error sensitivity logic operative to set a phase lock sensitivity window used to determine a fine lock/unlock condition of the generated output clock signal and operative to generate a fine phase lock/unlock signal based on the set phase lock sensitivity window.

15. The computer readable medium of claim 14 comprising executable instructions that when executed by one or more processors of a circuit design system, cause the circuit design system to produce an integrated circuit that comprises the programmable static phase error sensitivity logic that comprises a programmable register operatively coupled to:
- a first variable delay control circuit operatively coupled to receive an input reference frequency signal; and
- a second variable delay control circuit operatively coupled to receive the feedback reference frequency signal.

16. The computer readable medium of claim 15 comprising executable instructions that when executed by one or more processors of a circuit design system, cause the circuit design system to produce an integrated circuit that comprises a coarse lock detection circuit comprising a directional detection circuit operatively coupled to the programmable fine lock/unlock detection circuit and operative to detect a number of changes in phase direction between the input reference frequency signal and the feedback reference frequency signal and to generate a coarse lock signal.

17. The computer readable medium of claim 16 comprising executable instructions that when executed by one or more processors of a circuit design system, cause the circuit design system to produce an integrated circuit wherein the feedback clock generating circuit comprises a phase frequency detector operative to generate an up or down frequency detection signal based on a frequency difference between the reference input frequency signal and the feedback reference frequency signal and wherein the coarse lock detection circuit comprises a counter circuit operative to detect static phase error larger than that detected by the programmable fine lock/unlock detection circuit and is operatively responsive to the up frequency detection signal from the phase frequency detector.

18. The computer readable medium of claim 14 comprising executable instructions that when executed by one or more processors of a circuit design system, cause the circuit design system to produce an integrated circuit wherein the programmable fine lock/unlock detection circuit is operative to programmably control detection of phase changes between a reference input frequency signal and a feedback reference frequency signal with respect to the phase lock sensitivity window to and generates a fine phase lock signal when the phase changes are within the phase lock sensitivity window and generates a fine phase unlock signal when the phase changes are outside the phase lock sensitivity window and wherein the coarse lock detection circuit is operative to detect a frequency unlock condition.

19. The computer readable medium of claim 15 comprising executable instructions that when executed by one or more processors of a circuit design system, cause the circuit design system to produce an integrated circuit wherein the programmable static phase error sensitivity logic comprises logic operatively responsive to the first and second variable delay control circuits to generate the fine lock/unlock signal and wherein each of the first and second variable delay control circuits each comprises a multiplexing circuit and a plurality of delay stages coupled to inputs of the multiplexing circuit and wherein the multiplexing circuit is controlled based on control data from the programmable register.

\* \* \* \* \*